(12) United States Patent
Buchwalter et al.

(10) Patent No.: US 8,268,719 B2
(45) Date of Patent: Sep. 18, 2012

(54) SPROCKET OPENING ALIGNMENT PROCESS AND APPARATUS FOR MULTILAYER SOLDER DECAL

(75) Inventors: Stephen L. Buchwalter, Armonk, NY (US); Peter A. Gruber, Armonk, NY (US); Jae-Woong Nah, Armonk, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 12/983,292

(22) Filed: Jan. 1, 2011

(65) Prior Publication Data
US 2011/0097892 A1    Apr. 28, 2011

Related U.S. Application Data

(62) Division of application No. 11/869,573, filed on Oct. 9, 2007, now Pat. No. 7,928,585.

(51) Int. Cl.
*H01L 21/44* (2006.01)
(52) U.S. Cl. .................. 438/616; 257/E21.506; 29/843; 228/180.22
(58) Field of Classification Search .................... 438/616
See application file for complete search history.

(56) References Cited

U.S. PATENT DOCUMENTS

| | | | |
|---|---|---|---|
| 4,396,457 A | 8/1983 | Bakermans | 156/634 |
| 4,814,855 A | 3/1989 | Hodgson et al. | 174/558 |
| 5,065,227 A | 11/1991 | Frankeny et al. | 257/778 |
| 5,316,787 A | 5/1994 | Frankeny et al. | 427/97 |
| 5,418,688 A | 5/1995 | Hertz et al. | 361/790 |
| 5,673,846 A | 10/1997 | Gruber | 228/180.22 |
| 5,976,965 A | 11/1999 | Takahashi et al. | 438/616 |
| 6,030,889 A | 2/2000 | Aulicino et al. | 438/613 |
| 6,294,745 B1 | 9/2001 | Gruber | 174/263 |
| 2003/0164716 A1 | 9/2003 | Hsieh et al. | 324/758 |
| 2006/0261033 A1 | 11/2006 | Wolk et al. | 216/2 |

*Primary Examiner* — Stephen W Smoot
(74) *Attorney, Agent, or Firm* — The Law Offices of Robert J. Eichelburg; Robert J. Eichelburg

(57) ABSTRACT

A process for aligning at least two layers in an abutting relationship with each other comprises forming a plurality of sprocket openings in each of the layers for receiving a sprocket of diminishing diameters as the sprocket extends outwardly from a base, with the center axes of the sprocket openings in each layer being substantially alignable with one another, the diameter of the sprocket openings in an abutting layer for first receiving the sprocket being greater than the diameter of the sprocket openings in an abutted layer. This is followed by forming a plurality of reservoir openings in each of at least two of the layers and positioning the sprocket openings in the layers to correspond with one another and the reservoir openings in the layers to correspond with one another so that substantial alignment of the center axes of the corresponding sprocket openings in the layers effects substantial alignment of the center axes of the corresponding reservoir openings in the layers. Engaging the sprocket openings with the sprocket by inserting the end of the sprocket having the smallest diameter into the sprocket openings having the largest diameter in the layers and continuing through to the sprocket opening having the smallest diameter in the layers effects substantial alignment of the center axes of the corresponding sprocket openings and substantial alignment of the center axes of the corresponding reservoir openings in the layers. The invention also comprises apparatus for performing this process.

15 Claims, 5 Drawing Sheets

SPROCKET OPENING ALIGNMENT PROCESS AND APPARATUS FOR MULTILAYER SOLDER DECAL

The present application is a divisional application of U.S. patent application, Ser. No. 11/869,573, filed Oct. 9, 2007, now U.S. Pat. No. 7,928,585, which is incorporated into this application in its entirety.

FIELD OF THE INVENTION

The present invention generally relates to the field of injection molding of solder (IMS), and more particularly relates to the making of multilayer solder decals.

RELATED ART

Gruber et al. in their paper "Low-cost wafer bumping," *IBM Journal of Research and Development*, IBM JRD 49-4/5 (http://www.research.ibm.com/jpournal/rd/494/gruber.html) (Aug. 16, 2005) describe flip-chip solder-bump interconnections as the face-down soldering of integrated circuit (IC) devices to chip carriers by means of conductive bumps on the chip bond pad. The use of this bump technology also extends to passive filters, detector arrays and MEMs devices. IBM introduced this technology in the early 1960's with the solid logic technology in the IBM System/360™. It extended interconnection capabilities beyond existing wire-bonding techniques, allowing the area array solder-bump configuration to extend over the entire surface of the chip (die) providing solder bumps for interconnection to a substrate by the C4 (controlled collapse chip connection) solder reflow process. This allowed for the highest possible I/O (input/output) counts to meet the increasing demand for electrical functionality and reliability in IC technology.

The original wafer-bumping process of metal mask evaporation in which ball-limiting metallurgy (BLM) also known as under bump metallization (UBM) involve the evaporation onto a wafer surface of solder through mask openings in an area array fashion. The need for increased I/O density and count, and pressures to lower the cost of flip-chip interconnections have spurred the development of other wafer bumping techniques such as electroplating or stencil-printing/paste-screening (solder paste) bump processes.

Solder pastes consist of a mixture of solder metal and flux utilized in a reflow process that results in the formation of voids in the solder joint that in some applications can affect reliability. The end use dictates the selection of the solder paste process since some low-cost applications can tolerate voids. Some of the more newly developed bumping processes include transfer, printing, solder jetting, and bumpless and conductive particle applications.

As IBM's new interconnect technology, C4NP, however, continues to gain visibility and attention in the industry, new challenges arise in the area of solder on organic substrates. Here too the pad diameters and pitches (distance between pads) get ever smaller. Presently, the key method of applying solder to these pads comprise the use of solder paste screening, and limits of solder volume vs. pitch are already being encountered at 150 micron pitches. Inherent volume reductions of between 30-50% between the paste as applied and the final solder volume after reflow make it difficult to apply solder paste in sufficient volumes for ever smaller pitches. Consequently, at the tightest pitches, the screen openings for the solder paste application begin to overlap, thus fundamentally limiting the technology.

No easy solutions exist for these limitations. Other solder application technologies such as solder jetting and ball drop eliminate the volume reduction problem with solder paste. For jetting, however, the technology does not readily lend itself to mass production, but is more suited for prototyping. For ball drop, the expense of the preformed solder balls becomes ever higher with smaller sizes, and also presents difficulties of grappling with the methods of applying thousands of such balls quickly, efficiently, and on a large scale. Thus, both of these alternative solutions are not workable in manufacturing that requires precision, relatively high speed, and low cost processes.

Gruber, U.S. Pat. Nos. 5,673,846 and 6,294,745 describes a solder decal apparatus and process to provide a solution to these challenges, and while both disclose the advantages of external solder features to assure reliable transfer, as well as dual layer decals to achieve this, they do not disclose a robust method to provide alignment between the decal layers for efficient manufacture on a large scale. The decal layers have openings or reservoirs that hold solder subsequently transferred to a discreet area on an electronic device such as an integrated circuit (IC). Substantial alignment of the upright axes of the reservoirs in each layer assures maximum transfer of solder in the reservoirs to a discreet area on the electronic device. Misalignment reduces or prevents complete or substantially complete transfer of the solder, which in turn can have an adverse affect on the device or in the manufacturing process of the device. The present invention focuses on this substantial alignment as vital to the overall process and provides a process and apparatus compatible with this type of manufacturing that improves on and overcomes some of the difficulties encountered with the related art processes and apparatus.

SUMMARY OF THE INVENTION

The foregoing indicates a need for a process and apparatus to obtain a device comprising soldered electronic components, especially IC devices soldered to electrically conductive substrates, such as for example by using IMS processes and substantially minimizing or substantially eliminating any of the difficulties encountered in the related art processes and apparatus.

Accordingly, the present invention provides such a process and apparatus that address these needs to not only provide advantages over the related art, but also to substantially obviate one or more of the foregoing and other limitations and disadvantages of the related art, such as solder jetting, ball drop, and flux processes and compositions. The invention also comprises a product produced by the foregoing process or processes.

The description that follows sets forth features and advantages of the invention apparent not only from the description but also by practicing the invention. The written description, drawings, abstract of the disclosure, and the claims, or as any of the foregoing may be subsequently amended will set forth additional features and advantages of the invention and particularly point out the objectives and other advantages of the invention showing how they may be realized and obtained.

Briefly, IMS, the "parent" technology of C4NP, enables a wide range of solder features to be produced in a truly efficient manner for manufacture on a large scale. Gruber, in previously noted U.S. Pat. No. 5,673,846, describes one of the unique and novel solder decals that are possible with IMS. In one form, these decals use two or more layers and after fill and solidification, they produce solder features that are on the surface of one of the decal layers. This enables the solder to penetrate openings in the solder resist which is applied over the outside edges of solder pads on organic substrates. Since the pads are often up to 20 or more microns below the solder resist layer, this ability to "reach down" to the wetting pad is an enabling feature of these solder anchor decals.

However, to be truly manufactured efficiently and on a large scale, these multilayer decals must be alignable before solder injection. Our invention details a new method and apparatus to provide quick and repeatable alignment between several decal layers for efficient manufacture of electronic devices such as electronic circuits, e.g., IC devices on a large scale.

To achieve these and other advantages, and in accordance with the purpose of the invention as embodied and broadly described herein, the invention comprises aligning reservoir openings in solder decal layers by positioning the reservoir openings in at least two layers (an abutting layer and an abutted layer) to correspond with one another and provide a plurality of sprocket openings in each layer that correspond with one another so that alignment of the center axes of the sprocket openings will effect alignment of the center axes of the reservoir openings. We use the term "reservoir openings," as synonymous with reservoir chambers but will use "reservoir openings" to describe our invention. We construct the layers so that the sprocket openings in successive layer openings have diminishing diameters and then provide a sprocket comprising a tapered sprocket so that insertion of that part of the sprocket having the narrowest diameter into a sprocket opening in the layer having the largest sprocket opening diameter up through the sprocket opening in the layer having the narrowest sprocket opening diameter effects substantial alignment of the center axes of the sprocket openings and consequent substantial alignment of the center axes of the reservoir openings.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

Figure 2:
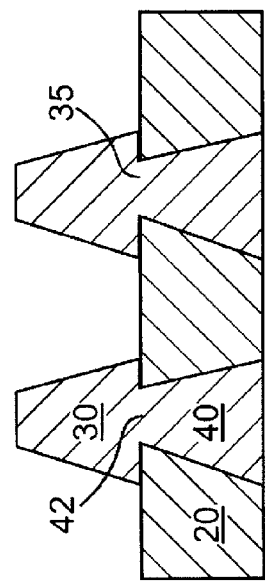
FIG. 2, a side elevation in cross section, substantially shows the structure of FIG. 1, but with the top decal layer removed after the solder has solidified to form a monolithic solder mass. Typical laser or chemical machining of one common decal material, polyimide, produces a tapered sidewall as shown. If both layers are oriented in the direction where the narrower opening faces up, the top decal layer can be readily peeled away since the resultant solder shape is non-reentrant in the direction of the decal peel. What remains is a protruding solder feature in a single layer decal held in place by mechanical anchoring.

We disclose the following detailed embodiments of the present invention as examples of the invention which can be embodied in various forms. These specific structural and functional details comprise a basis for the claims and a basis for teaching one skilled in the art to employ the present invention in any appropriately detailed process or structure. We also employ the terms and phrases of this disclosure to provide an understandable description of the invention.

To achieve these and other advantages, and in accordance with the purpose as embodied and broadly described herein we provide a process and apparatus for aligning a plurality of layers comprising at least two layers that can be positioned in an abutting relationship with each other comprising forming a plurality of sprocket openings in each of the layers for receiving a sprocket of diminishing diameters as the sprocket extends outwardly from a base, with the center axes of the sprocket openings in each layer being substantially alignable with one another, the largest diameter of the sprocket openings in an abutting layer for first receiving the sprocket being greater than the largest diameter of the sprocket openings in an abutted layer.

This is followed by forming or providing a plurality of reservoir openings in each of at least two of the layers comprising at least an abutting layer and at least an abutted layer, the center axes of the reservoir openings being substantially alignable with one another. We position the sprocket openings in the layers to correspond with one another and the reservoir openings in the layers to correspond with one another so that substantial alignment of the center axes of the corresponding sprocket openings in the layers effects substantial alignment of the center axes of the corresponding reservoir openings in the layers.

Engaging the sprocket openings with the sprocket by inserting the end of the sprocket having the smallest diameter into the sprocket openings having the largest diameter in the layers and continuing through to the sprocket opening having the smallest diameter in the layers effects substantial alignment of the center axes of the corresponding sprocket openings and substantial alignment of the center axes of the corresponding reservoir openings in the layers.

We provide for the diameter of the sprocket and the corresponding diameter of the sprocket openings to be arranged so that upon the insertion into the sprocket openings, the sprocket substantially abuts sprocket openings in corresponding layers but also allows the layers to substantially abut against one another and substantially prevent layer separation. The sprocket openings comprise a plurality of sprocket openings arranged in a substantially linear array in each of the layers, and the reservoir openings comprise a plurality of reservoir openings in each of the layers.

In another aspect, we assemble the plurality of layers so that the abutted layer is the outer-most layer of the plurality of layers. We define the outer-most layer as the abutted layer having the narrowest sprocket openings of the plurality of layers. In order to provide a mechanical anchoring mechanism, we arrange the reservoir openings in at least the abutting layer with diminishing diameters extending toward and opening into the reservoir openings in the abutted layer. In this embodiment we further provide for a process and apparatus for filling the reservoir openings with solder to form a monolithic solder mass extending from the reservoir openings in the abutting layer to the reservoir openings in the abutted layer with the reservoir openings in the abutting layer comprising a mechanical anchoring configuration to enable mechanically removing the abutted layer from the abutting layer without substantially removing the solder mass anchored in the reservoir openings in the abutting layer. In this and other embodiments we fill the reservoir openings with solder by scanning the reservoir openings under an IMS solder head.

In a further embodiment we provide a soldering operation and apparatus comprising means for advancing the layers to an abutted layer removal area, such as a rotating sprocket wheel, a ram or moving the layers by hand in the direction of the subsequent processing stations and/or apparatus. We then mechanically remove the abutted layer by prying the layers apart with apparatus well known in the art, to expose solder from the abutted layer as a three dimensional projection of the solder mass anchored in but extending outwardly from the abutting layer, and then bringing the solder projection into contact with a metallized contact pad capable of forming a metallurgical bond with the solder mass, heating the solder mass in a heated transfer area to substantially transfer the solder mass to the metallized contact pad and form a metallurgical bond with the metallized contact pad. We advance the layers to the outer layer removal area and heated transfer area by means of the sprockets, such as a plurality of sprockets extending from a curvilinear base or linear base and operatively engage the sprocket openings of the layers. The sprockets may comprise conical or frusto-conical sprockets extending from the base so that the smallest diameter of the sprocket projects away from the base In other embodiments, the layers comprise flexible layers that are windable on a rotating drum, and the metal pad comprises a metal pad operatively associated with an electronic device such an IC device.

Figure 1:
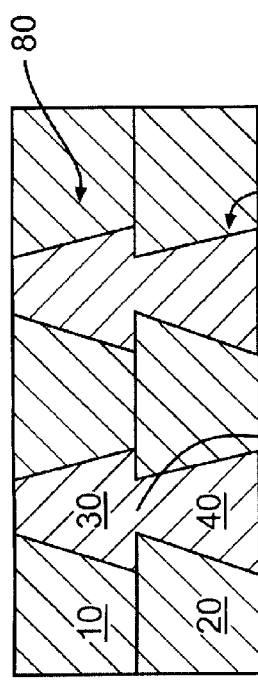
As seen in FIG. 1, a side elevation in cross section, two layers of solder decals are aligned and filled with molten solder by IMS to produce the structure shown. An important requirement is accurate alignment between the top and bottom decal layers. This, inter alia, is the key focus of this invention.

We illustrate aspects of the invention in the drawings in which FIG. 1 shows top decal layer 10 and bottom decal layer 20, which are typically made from polyimide, but can also be made from a number of other polymers that will not substantially degrade when exposed to temperatures employed to melt solder. These comprise inter alia epoxy polymers, phenolic polymers and the like, however, polymers such as these will generally not have the flexibility necessary for winding the layers on a drum and will be used in a flat or linear configuration or in combination with a flexible layer. Additionally, the layers may comprise metal layers, such as metals that solder will not adhere to such as stainless steel or other nickel or chromium alloys, aluminum, aluminum alloys, or nickel or chromium or aluminum coated metal or nickel, or chromium or aluminum coated polymers such as those noted herein and the like. Nickel or chromium or aluminum alloys may also be used as the metal coatings. Flexible layers, such as polyimide layers, allow for winding the layers on drums. As noted, layers that do not have sufficient flexibility can be advanced linearly. Shown also are frusto-conical shaped cavities 80 in top layer 10, and 90 in bottom layer 20 which are filled with molten solder 30 and 40 respectively that fuse to form a monolithic solder mass. We also refer to top layer 10 as the abutted layer and bottom layer 20 as the abutting layer when describing the process and apparatus of the invention that employs more than two layers. We also use this terminology in referring to the other embodiments of the process and apparatus of the invention.

FIG. 2 has top decal layer 10 removed which leaves solidified solder 30 as frusto-conical shaped features on the surface of bottom decal layer 20. Solder projections 30 remain when layer 10 is removed since they are connected to solder cones 40 through the top opening 35 of conical opening 90. This "anchoring" feature is strictly mechanical, not metallurgical, since there is no metallurgical attachment of the solder to the bottom polyimide layer 20.

Figure 3:
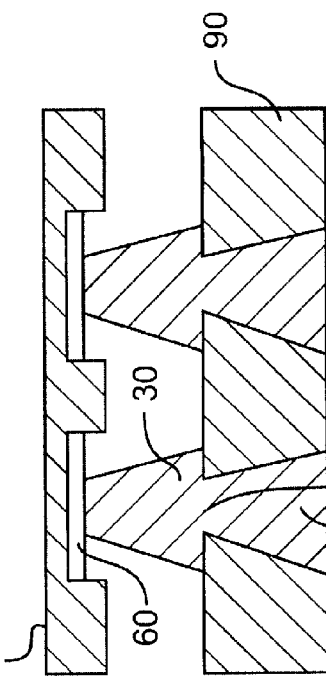
FIG. 3, a side elevation in cross section, shows the decal of FIG. 2 applied to a substrate requiring the solder application. As seen, the metallic pads on the substrate are below the substrate top surface. This requires the solder to protrude from the decals so that it can "reach" into the metallized pads, as shown.

FIG. 3 shows the features of FIG. 2 ready to transfer to a substrate 50 through bonding pads 60. Frusto-conical shaped solder features or projections 30 are aligned to contact the metallized pads 60 on substrate 50, even though these are recessed below the surface of substrate 50. This comprises a novel feature of this invention, namely that these projecting solder features can "reach down" or "reach into" recessed bonding pads before transfer of solder, thus assuring that solder wetting will take place once the assembly is heated.

Figure 4:
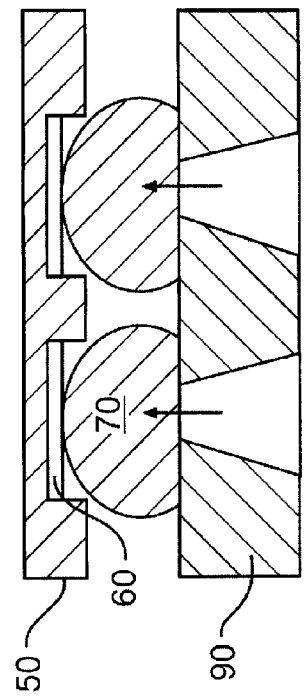
FIG. 4, a side elevation in cross section, shows the solder of FIG. 3 reflowing and wetting the pads. As the protruding portion of the solder melts and wets the pads, the solder in the reservoir opening of the bottom decal layer (the abutting layer) is pulled out of the reservoir opening through an exit port and provides the balance of the volume required to produce the solder bump shown.

FIG. 4 shows solidified solder 30 and 40 melting and wetting pads 60 to become solder bumps 70, which have the combined solder volume of the previous two frusto-conical shaped features (30 and 40). This step takes place by heating the joined assembly above the solder melting temperature for the time required to form a robust metallurgical bond between the molten solder and the pad metallurgy.

Figure 5:
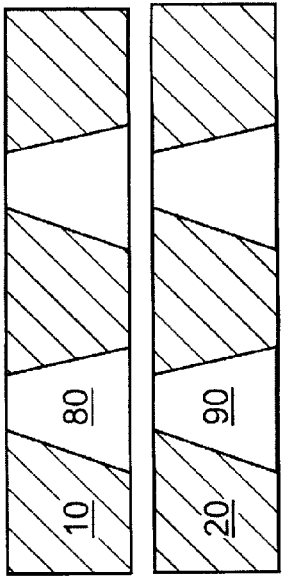
FIG. 5, a side elevation in cross section, shows both top and bottom decal layers (the abutting and abutted layers respectively) empty of solder after the transfer to the substrate. These two layers are ready to be realigned and refilled with solder.

FIG. 5 shows both top decal layer 10 and bottom decal layer 20 empty of solder, i.e., empty frusto-conical shaped openings 80 and 90. Since these are part of continuous films of material, they may be realigned and thereafter refilled with molten solder to begin this process sequence again. Reusability lowers the overall cost of this substrate bumping process.

Figure 7:
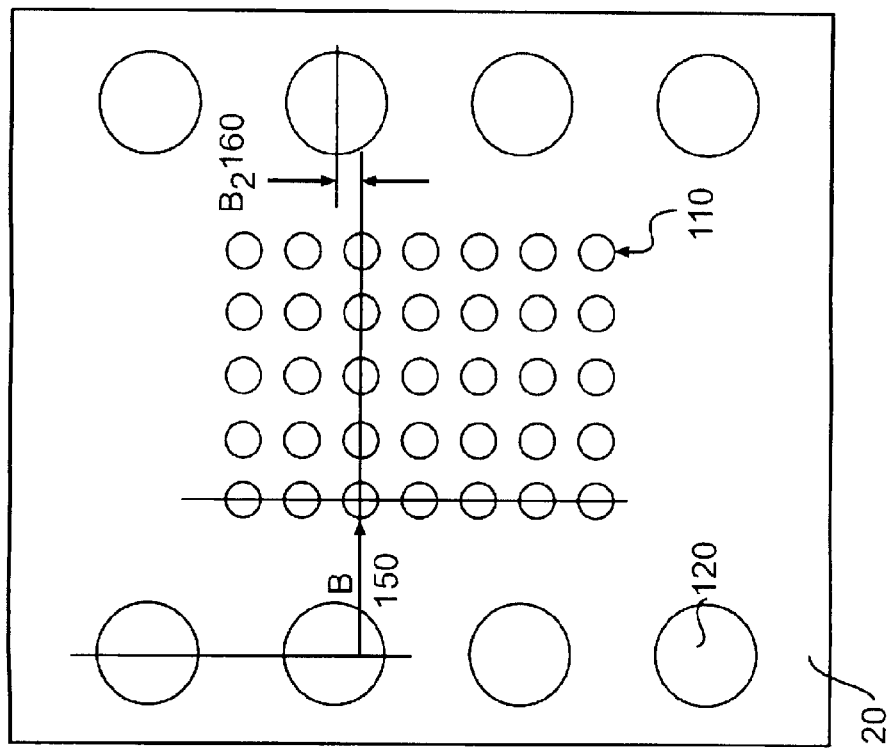
FIG. 7, a plan view, shows decal layer 2, which differs from layer 1 by having larger sprocket openings to achieve alignment.
Figure 6:
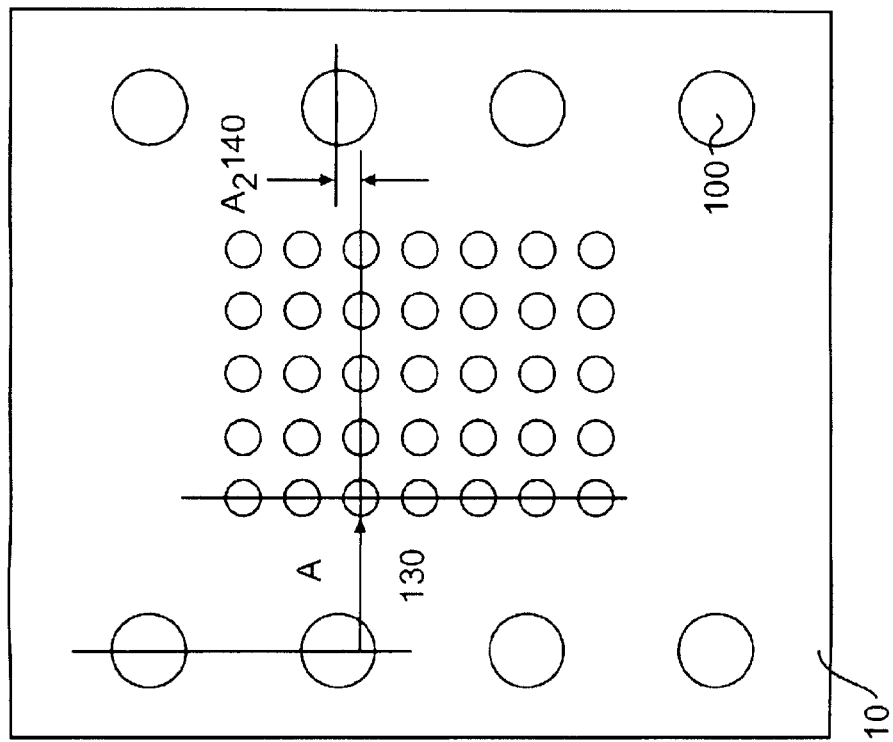
FIG. 6, a plan view, shows a detail of decal layer 1, which can be a top layer, showing the reservoir openings which will receive the solder and the sprocket openings which have dual functions of moving and aligning the decal material.

FIGS. 6 and 7 show a plan view of a section of the continuous film of polyimide, especially the sprocket openings 100 and 120 and reservoir openings 110. These two figures are described together, since they are used in this manner. Alignment of the center axes of the reservoir openings of these two layers, as described herein, allows molten solder to penetrate both layers and thereafter solidify, thus producing the previously described positive solder features.

Sprocket openings 100 in FIG. 6 showing the top decal layer 10 are slightly smaller than sprocket openings 120, the bottom decal layer 20 of in FIG. 7. This assures optimal alignment accuracy when engaged with tapered alignment pins described in later figures. The critical X-Y dimensions A 130 and $A_2$ 140 in FIG. 6 and B 150 and $B_2$ 160 in FIG. 7 assure that the much smaller reservoir openings 110 of each layer will accurately align before the solder filling takes place. When A 130 consistently equals B 150 and $A_2$ 140 consistently equals $B_2$ 160, alignment is guaranteed. Since these dimensions can be photolithographically defined, or etched by a well-known process using a programmable laser, this accuracy is readily achievable. The sprocket openings thus serve two functions: the main function of providing critical alignment between the decal layers, and the secondary function of moving the joined decal layers along the solder fill and solidification path. Since polyimide is a mechanically tough material, it can maintain positional accuracy for a workable lifetime of alignment of the decals.

The reservoir openings 110 in FIG. 7 and corresponding reservoir openings in FIG. 6, and other layers if more than two layers are employed, are circular in shape, although any shaped opening can be employed, such as a polygon having from 3 to about 10 sides, or more, or an ellipse, or other curvilinear configuration. For the purpose of this invention, and to define the geometry of these reservoir openings, these reservoir openings have a diameter, also referred to herein as the "x" axis, ascending or descending along a center axis or "z" axis (defined hereafter), and extending at substantially right angles, e.g., about 90° to the z axis in a flat plane between two opposite points that are at the widest part of the plane. The reservoir openings also include a "y" axis which lies in the same plane as the diameter, intersects the diameter or x axis substantially at the midpoint, and is at substantially right angles, e.g., about 90° to the diameter or x axis. The center axes of these openings, also referred to herein as the "z" axis, extends out of the plane of the diameter, and from a point that is substantially midway along the length of the diameter and is substantially at right angles, e.g., about 90° to the plane of the x axis and substantially right angles, e.g., about 90° to the y axis.

We obtain substantial alignment of the center axes of the reservoir opening according to the process of the invention and by means of the apparatus of the invention. When employing a round, or polygon or ellipse or other curvilinear reservoir openings in lieu of a round opening, we arrange the reservoir openings on the layers so that the reservoir openings' diameters extend in a common plane from the first layer to the last layer. For purposes of the invention, substantial alignment of the center axes can also includes this extension of the diameters in a common plane.

An essential feature of the reservoir openings comprises the exit ports 42 which allow any liquefied solid material in the reservoir to exit the reservoir after converting any solid material in the reservoir to a liquid material, as in the case of converting solid solder into molten solder. By making the diameter of the exit port narrower than the diameter of the reservoir, we mechanically anchor the solid material in the reservoir opening to resist force on the solid in the reservoir opening in a direction away from the exit port. In the embodiment illustrated in the drawings, we provide a frusto-conical reservoir opening with the narrowest diameter of the frusto-conical structure terminating at the exit port. We employ other embodiments, however, to achieve mechanical anchoring. Not only can we employ polygon reservoir openings with the exit port having a smaller diameter than the diameter of the reservoir opening, we employ such polygon reservoir opening with stepped sides, such as a pyramid that extends from its base to the exit port in a step-wise fashion.

Additionally, we employ reservoir openings with a bulge in the diameter of the reservoir openings, where we configure the bulge as a round disc, curvilinear disc (e.g. an ellipse) or a polygon disc, where the diameter of the bulge is greater than the diameter of the reservoir openings and greater than the diameter of the exit port. When we employ the bulge, we do not have to use reservoir openings having tapered side walls. We define the bulge diameter in the same way as the diameter of the reservoir openings. The asymmetry of this configuration provides the anchoring mechanism. We provide this anchoring mechanism in the reservoir opening comprising such an asymmetric configuration, and we position it somewhere along the z axis of the reservoir opening and before the exit port. We also construct this layer, with the bulge anchoring mechanisms from multiple layers, e.g., a first layer with a reservoir opening, a second layer with a bulge or disc configuration and a third layer with an exit port, with the various reservoir openings and exit ports, aligned as described. We then combine these multiple layers to act as a single layer that incorporates the bulge. We also use any combination of these structures to form this single layer.

We configure the exit ports and the bulge in the same way as the reservoir openings, i.e., they are circular in shape, although any shape can be employed, such as a polygon having from 3 to about 10 sides, or more, or an ellipse, or other curvilinear configuration. For the purpose of this invention, and to define the geometry of these configurations, they also have a diameter, referred to herein as the "x" axis, extending in a flat plane between two opposite points on the x axis plane of the exit ports or the x axis plane of the bulge that are at the widest part of these planes. They also include a "y" axis which lies in the same plane as the diameter, substantially intersects the midpoint of the diameter or x axis and is at substantially right angles, e.g., about 90° to the diameter or x axis. The center axis, also referred to herein as the "z" axis, extends away from the plane of the diameter from a point that is substantially midway along the length of the diameter or x axis and is substantially at right angles, e.g., about 90° to the plane of the x axis, and substantially right angles, e.g., about 90° to the y axis.

We can also arrange the exit ports and the bulges so that their diameters extend in a common plane ascending or descending along the z axis from the first layer to the last layer. In providing the locking mechanism referred to before, we can also provide an arrangement of more than one polygon or ellipse in assembling the layer with the locking mechanism wherein the polygons or ovals have substantially the same diameter but the diameters of the abutting polygon or ellipse in a first layer and the diameter of the polygon or ellipse in an abutted layer are at angles to one another. For example square openings can be provided in the abutting layer and the abutted area where the diameters are at angles to one another and when viewed in a plan view appear as an eight pointed star. In this instance, the diameters lie in a common plane that spirals along the z axis where the diameters, ascend and descend the z axis in a spiral. As in the previous description of the bulge configuration, the foregoing arrangement allows the construction of the reservoir openings so the side walls can be substantially parallel to the z axis, and do not have to be tapered. For purposes of the invention, substantial alignment of the center axes can also include the foregoing descriptions of the extension of the diameters in a common plane.

Figure 8:
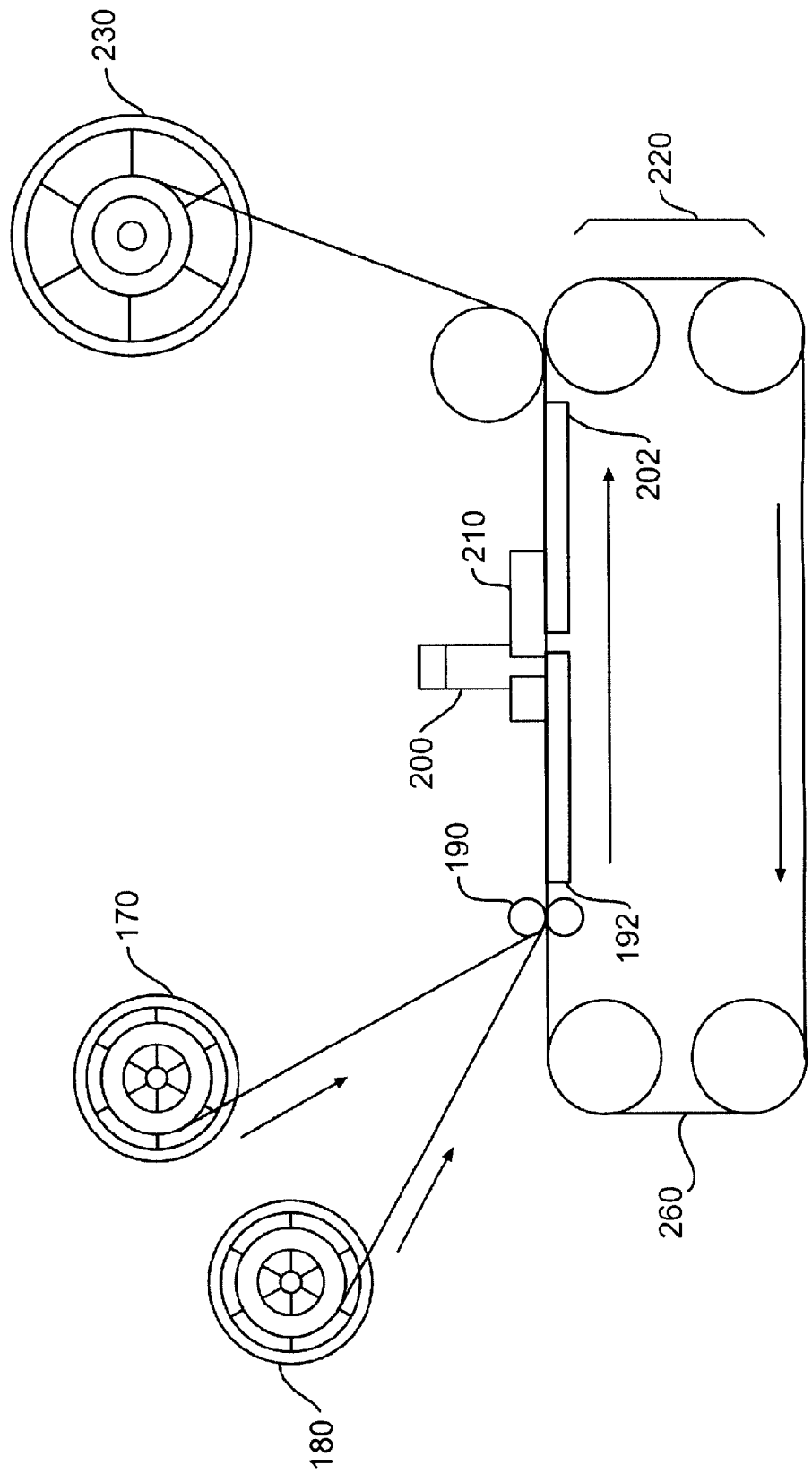
FIG. 8, a side elevation, shows the solder fill method and overall apparatus for achieving an aligned configuration between the two decal layers, comprised of two decal feed reels, an alignment pin loop and a single filled and joined decal take-up reel.

FIG. 8 shows the apparatus for achieving solder fill in aligned multilayer decals. Although only two layers are shown, it should be understood that three or more layers may be similarly processed. Reel 170 contains the polyimide film comprising the top decal layer and reel 180 contains the bottom decal layer. These two layers are aligned at the join/align stage 190, and thereafter the two joined and aligned layers are preheated at transfer heat zone 192 as they travel towards the IMS fill head 200, where the aligned feature openings are filled with molten solder. After fill, the joined layers continue to travel along alignment loop 220 over a cooling zone 202 that solidifies the solder while still under the solidification zone 210 of the IMS head. Finally the joined layers now containing solidified solder are taken up by reel 230 which is later used on the solder transfer apparatus.

Figure 9:
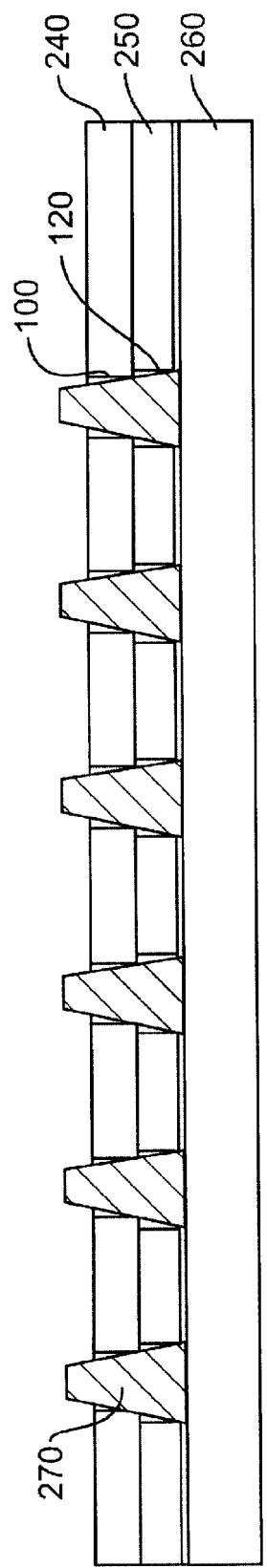
FIG. 9, a side elevation in cross section, shows a detail of the two decal layers, the align pin loop layer and the alignment pins engaged in both decal layers.

FIG. 9 is a detailed side view of the engagement of the tapered alignment pins 270 or sprockets attached to the belt 260 of the pin loop base 220. As the belt 260 containing tapered pins 270 moves in a linear direction, joined layers 240 and 250 are carried along in an aligned fashion under the slight resistance offered by the IMS fill head 200. The top layer 240 has the smaller sprocket openings and thus tightly hugs a narrower diameter higher up the tapered alignment pin, whereas bottom layer 250 has the wider sprocket openings, thus hugging the tapered alignment pins at a wider diameter closer to their bottom. In each case however, the sprocket openings are tightly fitted to the alignment pins due to their tapered nature. This assures that the key alignment feature is always present, as any play between the sprocket openings and alignment pin or sprocket would translate to a possible misalignment of the much smaller feature openings. We also arrange the geometry of the sprocket openings and the corresponding diameter of the sprockets so that upon insertion into the sprocket openings the sprocket not only substantially abuts the sprocket opening in abutting layers, but also allows these layers to abut against one another and substantially prevent layer separation during the alignment process. Stated otherwise we substantially avoid pushing the upper layer away from an abutting layer by sprocket diameters that are too wide for the abutting layer sprocket opening or upper layer sprocket opening diameters that are too narrow for the sprocket so as to substantially avoid pushing the layers apart.

The tapered alignment pins 270 or sprockets comprise frusto-conical pins with the top of this sprocket configuration being flat or domed. We also use sprockets having other tapered configurations, and geometrical configurations such as those described hereafter, e.g. tapered polygon shaped sprockets, elliptically shaped tapered sprockets and the like all with their axes and diameters aligned as described hereafter. In one embodiment we use a plane solid having saw teeth, with points, as well as teeth having points removed so as to form flat topped or domed teeth, similar to the frusto-conical sprockets. The side walls of any of the sprockets can be linear or curvilinear, especially, an elliptical wall or an epicycloid wall, the latter configuration being substantially the same as the gear engaging wall of gear teeth.

We configure the sprockets as tapered three-dimensional devices, having a diameter lying in a plane circular in shape, although any shape can be employed, such as a polygon having from 3 to about 10 sides, or more, or an ellipse, or other curvilinear configuration. For the purpose of this invention, and to define the geometry of these configurations, the diameter, referred to herein as the "x" axis, lies in a flat plane ascending or descending along a "z" axis or center axis (defined hereafter), and further extending at right angles to the z axis, e.g., about 90° to intersect two opposite points on the plane that are at the widest part of the plane. They also include a "y" axis which lies in the same plane as the diameter, substantially intersects the midpoint of the diameter or x axis and is at substantially right angles, e.g., about 90° to the diameter or x axis. The center axis, also referred to herein as the "z" axis, extends out of the plane of the diameter, and from a point that is substantially midway along the length of the diameter and is substantially at right angles, e.g., about 90° to the plane of the x axis and substantially right angles, e.g., about 90° to the y axis.

We can also arrange the sprockets so that their diameters extend in a common plane from the first layer to the last layer. For purposes of the invention, substantial alignment of the center axes can also includes this extension of the diameters in a common plane.

The belt 260 comprises a flexible belt known in the art, however, we also mount the sprockets on a wheel or chain (not illustrated) or a flat surface (not illustrated). The sprockets 270 and the sprocket openings, in one embodiment are arranged in a substantially linear path on layer 1 (FIG. 6) and layer 2 (FIG. 7), aligned in the direction of movement of the layers, and are placed especially on the edge of the layers and comprise one, or two or more arrays of sprocket openings and one, or two or more corresponding arrays of sprockets.

Figure 10:
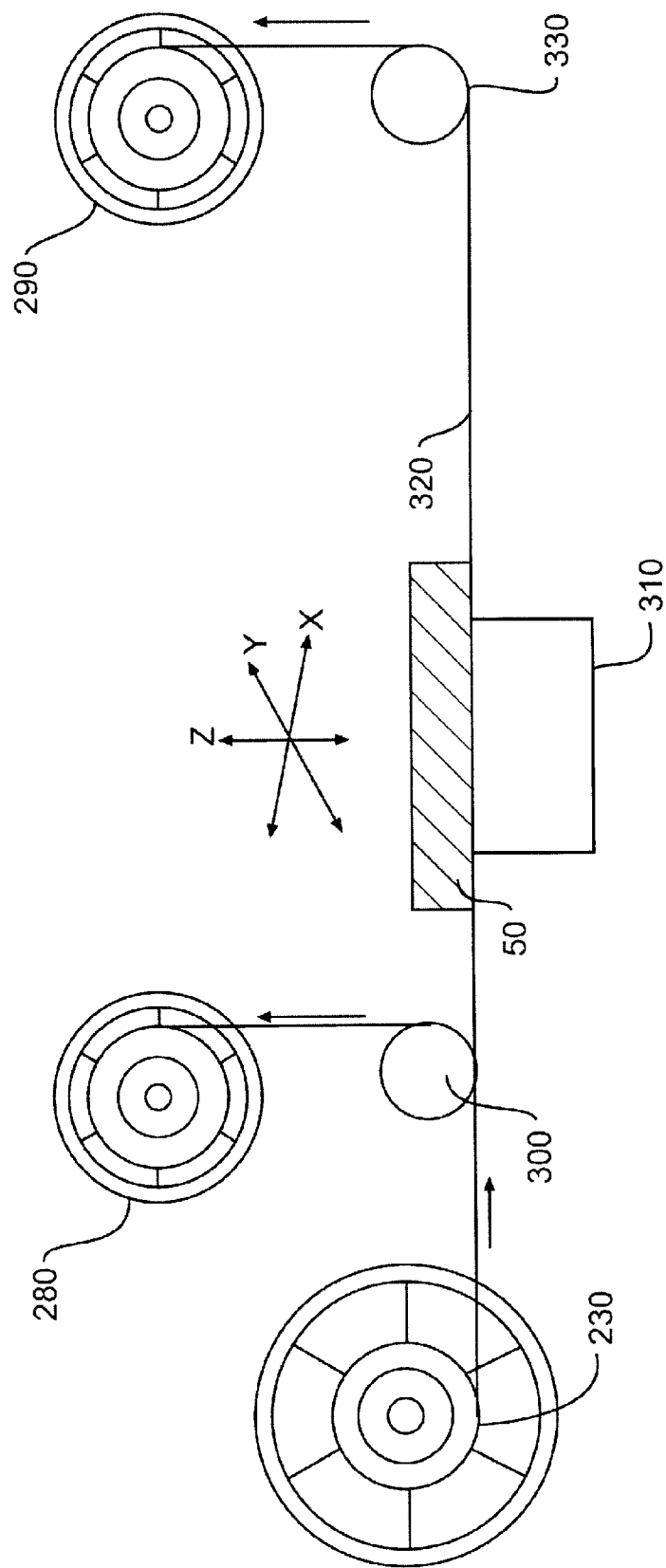
FIG. 10, a side elevation, shows transfer apparatus including a feed reel and empty layer take-up reels.

FIG. 10 shows the final sequence in using multilayer decals. This sequence is shown from an apparatus view, but the individual steps exactly match those in FIGS. 1-5. The bumped tape reel 230 has its two joined decal layers (A) fed into a separator 300 that removes the top decal layer by forcing it along a modest radius of curvature defined by the diameter of separator 300. This gentle separation assures that no frusto-conical solder features previously in top layer frusto-conical openings are torn from the frusto-conical solder features in the bottom decal layer. Since there is no metallurgical bond between solder and polyimide, the non reentrant contact in the top decal layer permits mechanical separation in this manner. The top decal layer (E), now empty of solder, is taken up by reel 280, leaving the bottom decal layer, now with two solder feature layers (B), including the top layer protruding above the top surface of the polyimide film, to continue on its way to the heated transfer area 310. At this point the solder in a specific array is preheated to prepare for transfer. Substrate 320 is mounted on a XYZ indexing stage that allows it to move to each site on the substrate that requires solder. The "XYZ" terminology used to define the indexing stage comprises the x, y, and z axes that the indexing stage moves on which we define in the same way as the x, y, and z, axes for the reservoir openings, the sprocket openings and the exit ports. Once the specific array has been located on the substrate and aligned to the array in the bottom decal layer, the indexer moves in a Z direction to push the solder against the substrate pads, the protruding frusto-conical features now actually touching with some force the metallized pads recessed below the substrate surface 50 (Cf. FIG. 3). After a pre-set time in which the decal layer lateral motion stops, the solder becomes molten and thus metallurgically wets the pads, and this also pulls the remaining solder out of the frusto-conical opening in the bottom layer (Cf. FIG. 4), the opening volume becoming a solder bump 70 attached to the pad 60. After this transfer step, the substrate is separated from the decal layer by its being moved in a reverse Z direction away from the decal layer. Thereafter, the bottom decal layer lateral motion resumes and the next solder array is indexed to the transfer position, while the now newly empty bottom decal layer continues to reel 290 (E). Although alignment is required between substrate and decal layer, in the transfer sequence there is no alignment required between the two decal layers; instead, as explained, only one decal layer is required for transfer. Thus, both the pins and sprocket openings may or may not be used to move the single bottom layer decal, as this can also be moved laterally simply by the take up reels 280 and 290, or any other device for laterally moving the bottom decal layer, such as a piston, lever, screw assembly and the like, all of which are known to the skilled artisan, the latter being employed where the process and/or apparatus employ a layer or layers that do not have the flexibility to conveniently wind them on a drum.

It should be noted, however, that for transfer, positional orientation of decal layer and substrate is not critical since surface tension and wetting forces far exceed the affects of gravity. Thus for transfer, as long as the external solder features of the decal layer face the corresponding pads on the substrate, the decal layer can be the top layer and the substrate the bottom layer or vice-versa.

Thus, In one aspect the present application comprises a process for aligning a plurality of layers comprising at least two layers that can be positioned in an abutting relationship with each other comprising forming a plurality of sprocket openings in each of the layers for receiving a sprocket of diminishing diameters as the sprocket extends outwardly from a base, with the center axes of the sprocket openings in each layer being substantially alignable with one another, the largest diameter of the sprocket openings in an abutting layer for first receiving the sprocket being greater than the largest diameter of the sprocket openings in an abutted layer, forming a plurality of reservoir openings in each of at least two of the layers comprising at least an abutting layer and at least an abutted layer, the center axes of the reservoir openings being substantially alignable with one another.

positioning the sprocket openings in the layers to correspond with one another and the reservoir openings in the layers to correspond with one another so that substantial alignment of the center axes of the corresponding sprocket openings in the layers effects substantial alignment of the center axes of the corresponding reservoir openings in the layers, engaging the sprocket openings with the sprocket comprising inserting the end of the sprocket having the smallest diameter into the sprocket openings having the largest diameter in the layers and continuing through to the sprocket opening having the smallest diameter in the layers to effect substantial alignment of the center axes of the corresponding sprocket openings and substantial alignment of the center axes of the corresponding reservoir openings in the layers, providing for the diameter of the sprocket and the corresponding diameter of the sprocket openings to be arranged so that upon the insertion into the sprocket openings, the sprocket substantially abuts sprocket openings in corresponding layers but also allows the layers to substantially abut against one another and substantially prevent layer separation during the alignment.

In another aspect of the invention, the sprocket openings comprise a plurality of sprocket openings arranged in a substantially linear array in each of the layers, and the reservoir openings comprise a plurality of reservoir openings in each of the layers. The invention further comprises a process for forming a multilayer solder decal wherein the layers comprise solder decal layers, as for example assembling the plurality of layers so that the abutted layer is the outer-most layer of the plurality of layers or where the reservoir openings in at least the abutting layer terminate in exit ports adjacent the abutted layer In the foregoing aspects, we may fill the reservoir openings with molten solder to form a monolithic molten solder mass extending from the reservoir openings in the abutting layer to the reservoir openings in the abutted layer, solidifying the molten solder mass to form a solidified molten solder mass, wherein the reservoir openings in the abutting layer comprise a mechanical anchoring configuration to enable mechanical removal of the abutted layer from the abutting layer without substantially removing the solidified solder mass anchored in the reservoir openings in the abutting layer. In this aspect, we may fill the reservoir openings with solder by scanning the reservoir openings under an IMS solder head.

In these aspects, the soldering operation may also comprise advancing the layers to an abutted layer removal area, removing the abutted layer to expose the solidified solder mass from the abutted layer as a three dimensional projection of the solidified solder mass anchored in but extending outwardly from the abutting layer, bringing the solder projection into contact with a metallized contact pad capable of forming a metallurgical bond with the solidified solder mass, heating the solidified solder mass in a heated transfer area to substantially melt and transfer the solder mass to the metallized contact pad and form a metallurgical bond with the metallized contact pad.

Throughout this specification, abstract of the disclosure, and in the drawings we have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compounds, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The term "about" or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" mean that which is largely or for the most part or entirely specified. The inventors also employ the terms "substantial," "substantially," and "about" in the same way as a person with ordinary skill in the art would understand them or employ them. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles as well as issued and pending patents that this written description mentions including the references cited in such scientific journal articles and other articles, and such patents, are incorporated herein by reference in their entirety for the purpose cited in this written description and for all other disclosures contained in such scientific journal articles and other articles as well as patents and the aforesaid references cited therein, as all or any one may bear on or apply in whole or in part, not only to this written description, but also the abstract, claims, and appended drawings of this application.

Although the inventors have described their invention by reference to some embodiments, other embodiments defined by the doctrine of equivalents are intended to be included as falling within the broad scope and spirit of the foregoing written description, drawings, abstract of the disclosure, and claims.

We claim:

1. A process for aligning a plurality of layers comprising at least two layers that can be positioned in an abutting relationship with each other comprising forming a plurality of sprocket openings in each of said layers for receiving a sprocket of diminishing diameters as said sprocket extends outwardly from a base, with the center axes of said sprocket openings in each layer being substantially alignable with one another, the largest diameter of the sprocket openings in an abutting layer for first receiving said sprocket being greater than the largest diameter of the sprocket openings in an abutted layer, forming a plurality of reservoir openings in each of at least two of said layers comprising at least an abutting layer and at least an abutted layer, the center axes of said reservoir openings being substantially alignable with one another, positioning said sprocket openings in said layers to correspond with one another and said reservoir openings in said layers to correspond with one another so that substantial alignment of said center axes of said corresponding sprocket openings in said layers effects substantial alignment of said center axes of said corresponding reservoir openings in said layers, engaging said sprocket openings with said sprocket comprising inserting the end of said sprocket having the smallest diameter into said sprocket openings having the largest diameter in said layers and continuing through to the sprocket opening having the smallest diameter in said layers to effect substantial alignment of said center axes of said corresponding sprocket openings and substantial alignment of said center axes of the corresponding reservoir openings in said layers, providing for the diameter of said sprocket and the corresponding diameter of said sprocket openings to be arranged so that upon said insertion into said sprocket openings, said sprocket substantially abuts sprocket openings in corresponding layers but also allows said layers to substantially abut against one another and substantially prevent layer separation during said alignment.

2. The process of claim 1 wherein said sprocket openings comprise a plurality of sprocket openings arranged in a substantially linear array in each of said layers, and said reservoir openings comprise a plurality of reservoir openings in each of said layers.

3. The process of claim 2 further comprising a process for forming a multilayer solder decal wherein said layers comprise solder decal layers.

4. The process of claim 3 comprising assembling said plurality of layers so that said abutted layer is the outer-most layer of said plurality of layers.

5. The process of claim 4 comprising providing said reservoir openings in at least said abutting layer, said reservoir openings terminating in exit ports adjacent said abutted layer.

6. The process of claim 5 comprising filling said reservoir openings with molten solder to form a monolithic molten solder mass extending from said reservoir openings in said abutting layer to said reservoir openings in said abutted layer, solidifying said molten solder mass to form a solidified molten solder mass, wherein said reservoir openings in said abutting layer comprise a mechanical anchoring configuration to enable mechanical removal of said abutted layer from said abutting layer without substantially removing said solidified solder mass anchored in said reservoir openings in said abutting layer.

7. The process of claim 6 comprising filling said reservoir openings with solder by scanning said reservoir openings under an IMS solder head.

8. The process of claim 6 further comprising a soldering operation comprising advancing said layers to an abutted layer removal area, removing said abutted layer to expose said solidified solder mass from said abutted layer as a three dimensional projection of said solidified solder mass anchored in but extending outwardly from said abutting layer, bringing said solder projection into contact with a metallized contact pad capable of forming a metallurgical bond with said solidified solder mass, heating said solidified solder mass in a heated transfer area to substantially melt and transfer said solder mass to said metallized contact pad and form a metallurgical bond with said metallized contact pad.

9. The process of claim 8 comprising advancing said layers to said outer layer removal area and heated transfer area by means of said sprockets.

10. The process of claim 9 comprising providing a plurality of sprockets extending from a curvilinear base or linear base and operatively engaging said sprocket openings of said layers.

11. The process of claim 10 comprising providing conical or frusto-conical sprockets extending from said base so that the smallest diameter of said sprocket projects away from said base.

12. The process of claim 10 comprising providing said layers as flexible layers that are windable on a rotating drum.

13. The process of claim 12 comprising providing said metal pad as a metal pad operatively associated with an electronic device.

14. The process of claim 13 wherein said electronic device comprises an IC device.

15. The process of claim 12 comprising providing said reservoir openings in at least said abutting layer with diminishing diameters extending toward and opening into said reservoir openings in the abutted layer so that the diameter of said exit ports at least in the abutting layer is narrower than any diameter of said reservoir openings.

* * * * *